(12) United States Patent
Srivastava et al.

(10) Patent No.: US 10,395,941 B1
(45) Date of Patent: Aug. 27, 2019

(54) SADP METHOD WITH MANDREL UNDERCUT SPACER PORTION FOR MANDREL SPACE DIMENSION CONTROL

(71) Applicant: GLOBALFOUNDRIES INC., Grand Cayman (KY)

(72) Inventors: Ravi P. Srivastava, Clifton Park, NY (US); Hsueh-Chung Chen, Cohoes, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 16/106,174

(22) Filed: Aug. 21, 2018

(51) Int. Cl.
*H01L 21/308* (2006.01)
*H01L 21/033* (2006.01)
*H01L 21/8234* (2006.01)

(52) U.S. Cl.
CPC ...... *H01L 21/3086* (2013.01); *H01L 21/0337* (2013.01); *H01L 21/0338* (2013.01); *H01L 21/3088* (2013.01); *H01L 21/823468* (2013.01)

(58) Field of Classification Search
None
See application file for complete search history.

(56) References Cited

U.S. PATENT DOCUMENTS

| 8,741,763 | B2 | 6/2014 | Ma et al. |
| 8,921,225 | B2 | 12/2014 | Yuan et al. |
| 9,379,116 | B1* | 6/2016 | Kim ................. H01L 27/10879 |
| 2003/0197872 | A1 | 10/2003 | Littau et al. |
| 2006/0060562 | A1* | 3/2006 | Furukawa ........... H01L 21/0337 216/41 |
| 2011/0156123 | A1* | 6/2011 | Fumitake .......... G11C 16/0441 257/315 |
| 2013/0065397 | A1* | 3/2013 | Chen ................. H01L 21/0337 438/703 |

* cited by examiner

*Primary Examiner* — Shamim Ahmed
(74) *Attorney, Agent, or Firm* — Anthony Canale; Hoffman Warnick LLC

(57) ABSTRACT

A self-aligned double patterning (SADP) method is disclosed. The method may include forming a mandrel over an underlying layer, and undercutting the mandrel forming an undercut space under opposing sides of the mandrel. A pair of spacers may be formed adjacent the mandrel, each spacer including a vertical spacer portion on each side of the mandrel and an undercut spacer portion extending into the undercut space from the vertical spacer portion, the undercut spacer portions defining a sub-lithographic lateral dimension therebetween. The mandrels may be removed and, a sub-lithographic feature etched into at least the underlying layer using the spacers.

20 Claims, 18 Drawing Sheets

SADP METHOD WITH MANDREL UNDERCUT SPACER PORTION FOR MANDREL SPACE DIMENSION CONTROL

BACKGROUND

The present disclosure relates to self-aligned double patterning (SADP) for semiconductor device fabrication, and more specifically, to an SADP method using spacers having mandrel undercut spacer portions that provide dimension control for the mandrel space.

Photolithography is a technique for transferring an image rendered on one media onto another media photographically. Photolithography techniques are widely used in semiconductor fabrication. Typically, a circuit pattern is rendered as a positive or negative mask image which is then projected onto a silicon substrate coated with photosensitive materials (e.g., PR). Radiation impinges on the masked surface to chemically change those areas of the coating exposed to the radiation, usually by polymerizing the exposed coating. The un-polymerized areas are removed, being more soluble in the developer than the polymerized regions, and the desired image pattern remains.

In the microelectronics industry as well as in other industries involving construction of microscopic structures (e.g., micromachines, magnetoresistive heads, etc.) there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates. FETs and capacitors, for example. Circuit chips with hundreds of millions of such devices are common.

In order to achieve further size reductions exceeding the physical limits of trace lines and micro-devices that are embedded upon and within their semiconductor substrates, techniques that exceed lithographic capabilities have been employed. Self-aligned double patterning (SADP), also known as sidewall image transfer (SIT), is one such technique to generate sub-lithographic structures. SADP involves the usage of a sacrificial structure (e.g., a mandrel, typically composed of a polycrystalline silicon), and a sidewall spacer (such as silicon dioxide or silicon nitride, for example) having a dimension less than that permitted by the current lithographic ground rules formed on the sides of the mandrel (e.g., via oxidization or film deposition and etching). After removal of the mandrel, the remaining sidewall spacer is used as a hard mask (HM) to etch the layer(s) below, for example, with a directional reactive ion etch (RIE). Since the sidewall spacer has a sub-lithographic lateral dimension, i.e., width, (less than lithography allows), the structure formed in the layer below will also have a sub-lithographic lateral dimension.

One challenge with SADP processing is continuing to reduce and control the lateral critical dimension (CD) of the mandrel, which controls the spacing between structures formed by the sidewall spacers. The lateral CD of the mandrel size controls the spacing between sidewall spacers formed thereabout. This space between sidewall spacers formed aside the mandrel is referred to as the 'mandrel space.' A size of a space between sidewall spacers on adjacent mandrels is controlled by the spacing between adjacent mandrels and the thickness of the sidewall spacer material. This latter space is referred to as the 'non-mandrel' space. At the 7 nm technology node and beyond, controlling the mandrel's lateral CD (i.e., width) is very difficult due to, for example, photolithography limitations in printing a small mandrel, and etching limitations in reducing dimensions too much.

SUMMARY

An aspect of the disclosure is directed to a self-aligned double patterning (SADP) method, comprising: forming a mandrel over an underlying layer; undercutting the mandrel forming an undercut space under opposing sides of the mandrel; depositing a spacer material over the mandrel and into the undercut space under the opposing sides of the mandrel; etching the spacer material, forming a pair of spacers adjacent the mandrel, each spacer including a vertical spacer portion on each side of the mandrel and an undercut spacer portion extending into the undercut space from the vertical spacer portion, the undercut spacer portions defining a sub-lithographic lateral dimension therebetween; removing the mandrel; and etching to form a sub-lithographic feature in at least the underlying layer using the spacers.

Another aspect of the disclosure includes a method for self-aligned double patterning (SADP), the method comprising: forming a plurality of mandrels over an underlying layer, each mandrel including a mandrel body; after forming the plurality of mandrels, measuring a lateral dimension of the mandrel body of at least one selected mandrel; determining whether the measured lateral dimension of each selected mandrel meets a target lateral dimension; for each selected mandrel for which the measured lateral dimension is larger than the target lateral dimension, undercutting the mandrel body thereof thereby forming an undercut mandrel including an undercut space under opposing sides of the respective mandrel body such that a lateral dimension of a remaining portion of material between the undercut spaces matches the target lateral dimension; depositing a spacer material over the plurality of mandrels, the spacer material extending into the undercut space under the opposing sides of each undercut mandrel; etching the spacer material to form a pair of spacers adjacent each mandrel, each spacer including a vertical spacer portion on each side of a respective mandrel, wherein each undercut mandrel further includes an undercut spacer portion extending into the undercut spaces thereof from the respective vertical spacer portions, the undercut spacer portions defining a sub-lithographic lateral dimension therebetween; removing each mandrel; and etching to form a sub-lithographic feature in at least the underlying layer.

An aspect includes a self-aligned double patterning (SADP) method, comprising: undercutting a mandrel over an underlying layer, forming an undercut space under opposing sides of the mandrel; depositing a spacer material over the mandrel and into the undercut space under the opposing sides of the mandrel; etching the spacer material, forming a pair of spacers adjacent the mandrel, each spacer including a vertical spacer portion on each side of the mandrel and an undercut spacer portion extending into the undercut space from the vertical spacer portion, the undercut spacer portions defining a sub-lithographic lateral dimension therebetween; removing the mandrel; and etching to form a sub-lithographic feature in at least the underlying layer using the spacers.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
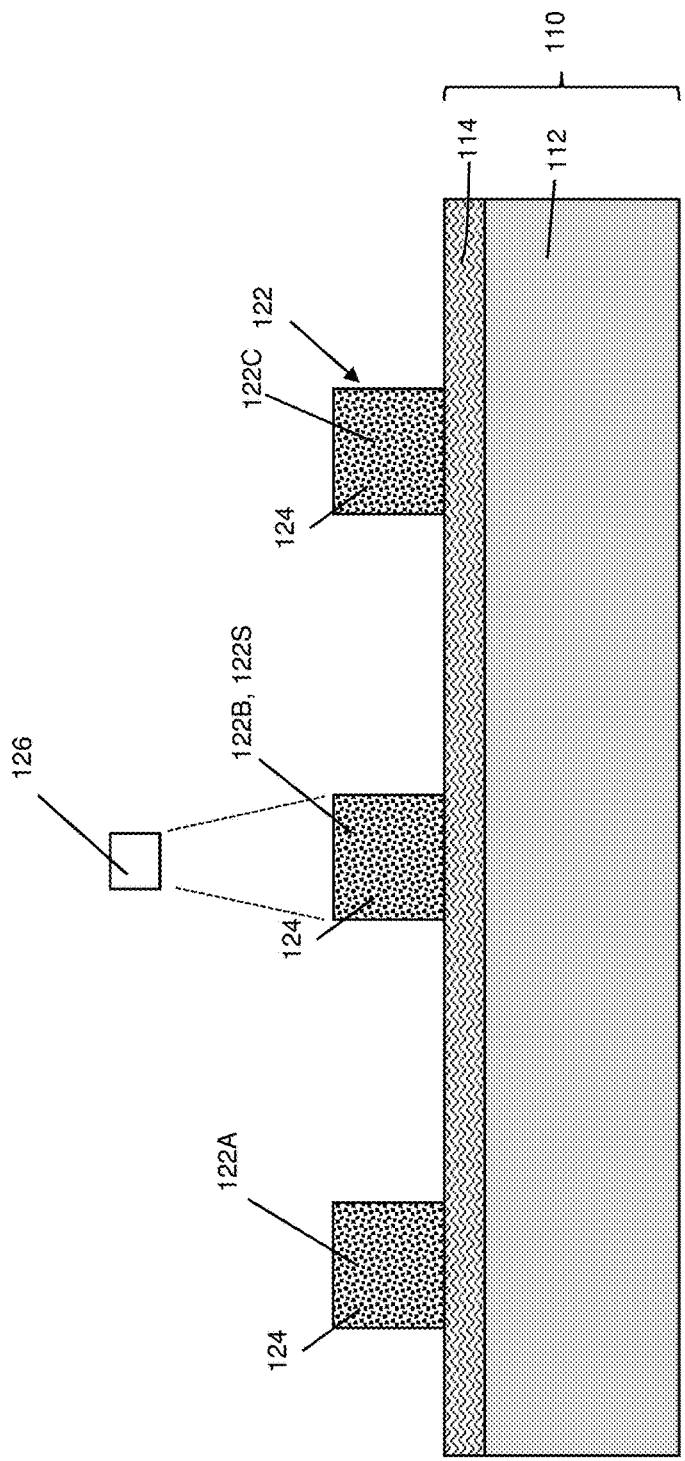
FIGS. 1-9 show cross-sectional views of a controlling a lateral dimension of a mandrel space using undercutting of the mandrel into a hard mask, according to embodiments of the invention.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide methods for SADP that include undercutting a mandrel, and filling the undercut space with a spacer material when forming spacers about the mandrel. The resulting spacers each includes a vertical spacer portion on each side of the mandrel, and an undercut spacer portion extending into the undercut space from the vertical spacer portion. The undercut spacer portions define a lateral dimension therebetween that is not possible of formation using a mandrel in the 7 nm technology node and beyond. The mandrel space lateral dimension may be sub-lithographic. As used herein, "sub-lithographic" refers to a lateral dimension (side-to-side as shown in drawings) or width of the respective feature, i.e., a space between spacers used as a hard mask, or sub-lithographic structure formed thereby.

For purposes of description, an SADP method according to embodiments of the disclosure is applied to an underlying layer 110. As understood in the field, SADP methods may be applied to a variety of underlying layers. FIG. 1 shows one non-limiting example in which underlying layer 110 includes a dielectric layer 112 and hard mask 114 arrangement. It is also understood that dielectric layer 112 may be any other form of layer(s) into which a sub-lithographic feature is to be formed. In other non-limiting examples, dielectric layer 112 could be replaced with a semiconductor-on-insulator (SOI) substrate, or a bulk semiconductor substrate. Dielectric layer 112 may include any interlayer dielectric such as but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phosphosilicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. The description of embodiments of the disclosure will be illustrated relative to dielectric layer 112 only. It is emphasized that teachings of the invention are equally applicable to any form of layer in which sub-lithographic features are desired, e.g., a bulk semiconductor substrate.

Hard mask 114 may be formed prior to forming a plurality of mandrels 122, as will be described. The term "mask" may be given to a layer of material which is applied over a layer of material, and patterned to have openings, so that the layer can be processed where there are openings. After processing the layer, the mask may be removed. Common masking materials are silicon oxynitride (SiON), nitride, oxide, low-k or high-k dielectrics. These materials are usually considered to be a "hard mask." In the instant case, hard mask 114 may include, for example, silicon oxynitride (SiON). Alternatively, hard mask 114 could include multiple layers such as a pad silicon nitride ($Si_3N_4$) layer over a thinner, pad oxide ($SiO_2$) layer (not shown). While hard mask 114 may have various thicknesses, in one example, the overall thickness may be approximately 20 to approximately 50 nm.

As also shown in FIG. 1, methods according to embodiments of the disclosure may include forming a plurality of mandrels 122 over underlying layer 110, e.g., hard mask 114 over dielectric layer 112. In one embodiment, each mandrel 122 includes a mandrel body 124. While three mandrels 122A-122C have been illustrated, it is understood that any number of mandrels may be provided. In one embodiment, mandrels 122A-C may be formed by depositing sacrificial material and then patterning the sacrificial material into the plurality of material blocks, i.e., mandrel bodies, in any now known or later developed manner. In one embodiment, mandrel bodies 124 of mandrels 122A-C, may include polysilicon, amorphous silicon, amorphous carbon, etc. "Depositing" may include any now known or later developed techniques appropriate for the material to be deposited including but are not limited to, for example: CVD, low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. The patterning may include using any conventional photoresist, exposing it and etching accordingly to create mandrels 122, followed by a photoresist strip.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Figure 2:
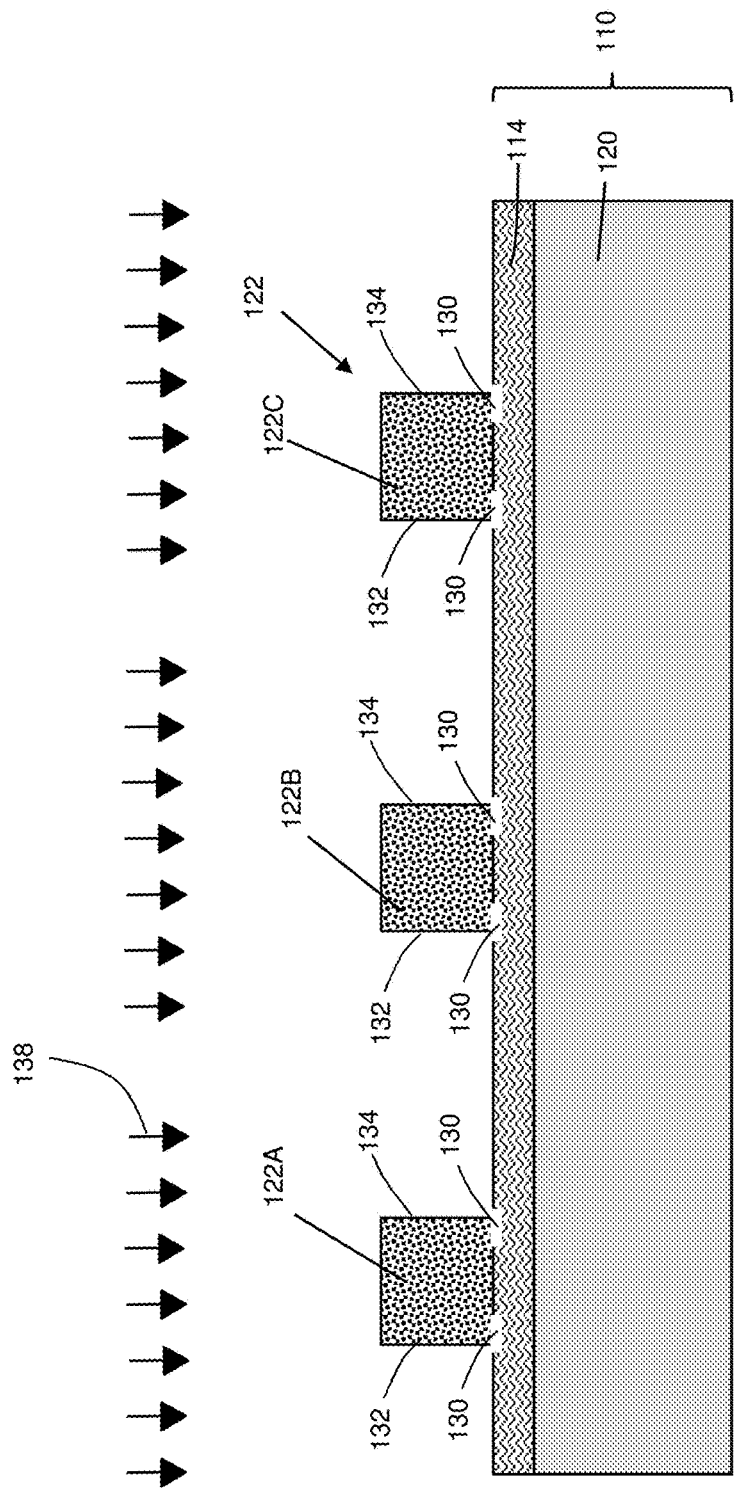
Figure 3:
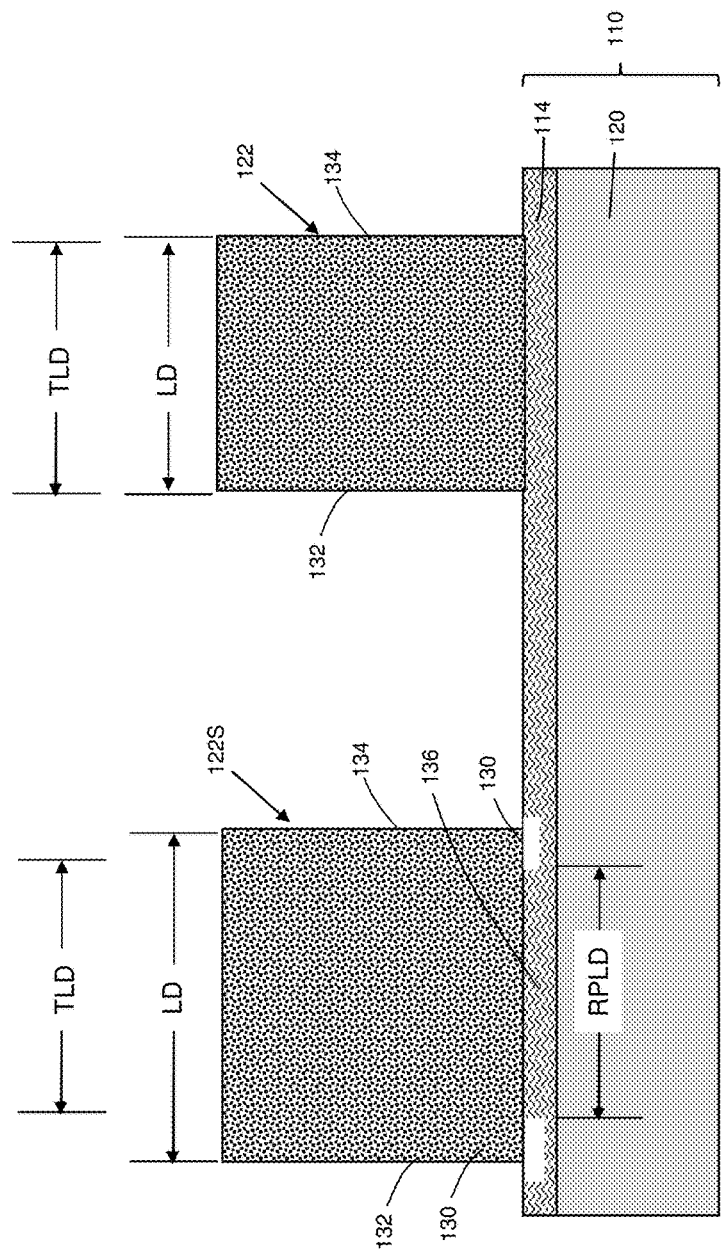

In contrast to conventional SADP methods, as shown in FIGS. 2 and 3, embodiments of the disclosure may include undercutting mandrel(s) 122A-C, forming an undercut space 130 under opposing sides 132, 134 of each mandrel 122A-C. This process may be applied to mandrels immediately after formation, as described above, or may be applied to wafers having mandrels that may require rework, i.e., sometime after mandrel formation. In any event, the undercutting may include a wet etch 138 configured to precisely size undercut space 130. In one embodiment, each undercut space 130 may be 10-12 nm (across different pitches/features). Undercutting of mandrel(s) 122A-C in accordance with embodiments of the disclosure may be applied generally to each mandrel 122, as will be described herein. Alternatively, in one embodiment of the disclosure, as shown in FIG. 3, undercutting mandrel(s) 122A-C in accordance with embodiments of the disclosure may be applied only to selected mandrel(s) 122S of plurality of mandrels 122 that require the undercutting. More particularly, at this stage of processing, as shown in FIG. 3, certain mandrel(s) 122S that have been formed may not have a lateral dimension (LD) that meets a target lateral dimension (TLD). That is, a later dimension (LD), e.g., a side-to-side width, may not meet a target lateral dimension (TLD) as desired in a specification for the integrated circuit (IC). As used herein, "meet" indicates that the lateral dimension is identical with, or within a desired tolerance of, a target lateral dimension, e.g., +/−0.5 nanometers, or +/−1.0 nanometers. In this embodiment, as shown in FIG. 1, after forming mandrel(s) 122A-C and prior to any undercutting, a lateral dimension (LD) of one or more of selected mandrel(s) 122 is/are measured. The target lateral dimension (TLD) may vary depending on the structure to be built based on a selected mandrel 122S, i.e., different mandrels may have different target lateral dimensions. The selected mandrel(s) 122S to be measured can be any of the mandrels, and can be selected in any fashion, e.g., by region, randomly or by direct choice. That is, one or more of the mandrels, or all of the mandrels, can be measured. In any event, the measurement can be performed using any now known or later developed metrology instrument 126 (FIG. 1) configured for use in semiconductor fabrication, e.g., a scatterometer, scanning electron microscope, etc. Ideally, the measurement is performed in-line, i.e., during manufacturing, but this is not required.

Once the lateral dimension is measured, a determination is made as to whether the measured lateral dimension (LD) (FIG. 2) of mandrel 122S meets a target lateral dimension (TLD) is conducted. The determination can be carried out using any now known or later developed manner such as but not limited to: manually through visual observation or automatically using, for example, a computer aided metrology system typically used in the semiconductor fabrication industry, e.g., by comparison of the LD to the TLD (see FIG. 3). In the non-limiting example shown in FIG. 3, the measured lateral dimension (LD) of selected mandrel 122S is larger than target lateral dimension (TLD). In this case, if selected mandrel 122S was used as is, the mandrel spacing of hard mask spacers used to create sub-lithographic opening in underlying layer 110 would be too large. In order to address this problem, in response to the measured lateral dimension (LD) being larger than the target lateral dimension (TLD), an undercutting of selected mandrel 122S, as shown in FIG. 3, is performed. FIG. 2 shows all of the mandrels 122A-C being undercut, while FIG. 3 shows only selected mandrel(s) 122S being undercut. Where the measured lateral dimension (LD) meets the target lateral dimension (TLD) (right side of FIG. 3) or is smaller than the target lateral dimension (TLD), the undercutting may be skipped as unnecessary. The undercutting can be performed for each selected mandrel 122S for which the measured lateral dimension is larger than the target lateral dimension. Other mandrels meeting the target lateral dimension (TLD) can be protected using, for example, a mask (not shown), during the undercutting.

Regardless of how approached, the undercutting is controlled to form undercut space 130 under opposing sides 132, 134 of mandrel(s) 122 such that a lateral dimension (RPLD) of a remaining portion 136 of material (e.g., hard mask 114) between undercut spaces 130 matches target lateral dimension (TLD). As will be described, a dimension of remaining portion 136 sets the lateral dimension of the structure to be formed using hard mask 114 patterned using the spacers in remaining parts of the SADP process according to embodiments of the disclosure. As shown in FIG. 2, the undercutting may include a wet etch 138 configured to precisely size undercut spaces 130. The interface between mandrel 122 and hard mask 114 is such that hard mask 114 is more prone to etching under sides 132, 134 of mandrel 122 than at other locations thereof. In one non-limiting example, the undercutting may be performed in an Applied Materials® Selectra® model etching system, which is capable of controlled wet etching 138 with very high selectivity. The undercutting can be monitored using an in-line metrology system (not shown), such as a scatterometer capable of measuring undercut multi-layer diffracting signatures. One example of such a system is described in US Patent Application Publication No. 2003/0197872. A directional RIE may also alternatively be employed to perform the undercut. In this embodiment, undercutting mandrels 122 forms undercut space 130 in underlying layer 110, e.g., hard mask 114.

Figure 4:
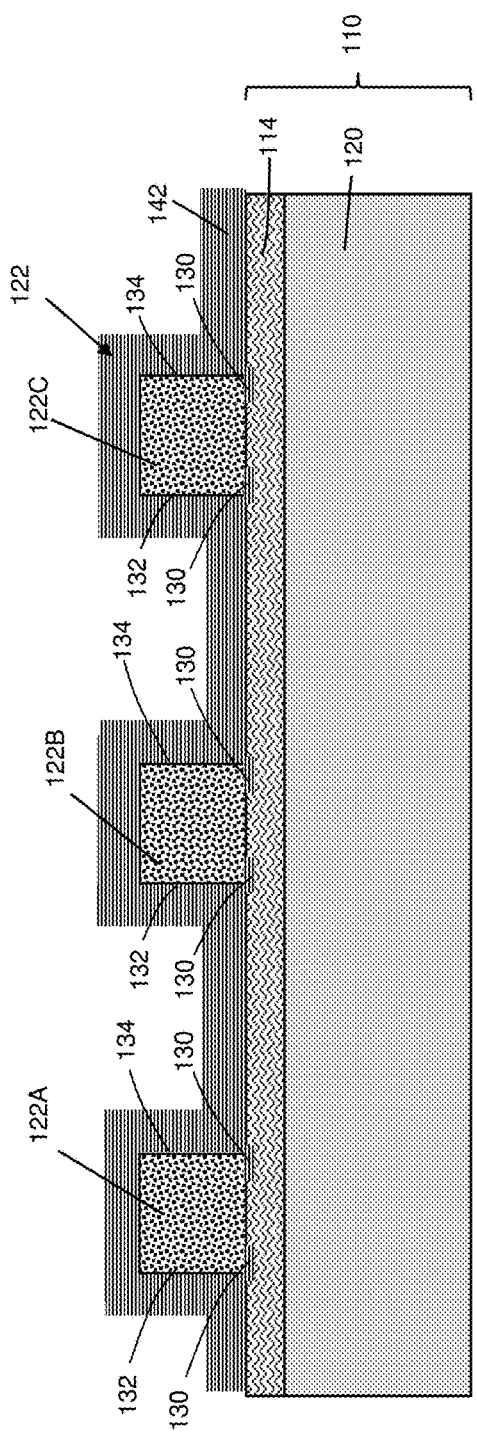
Figure 5:
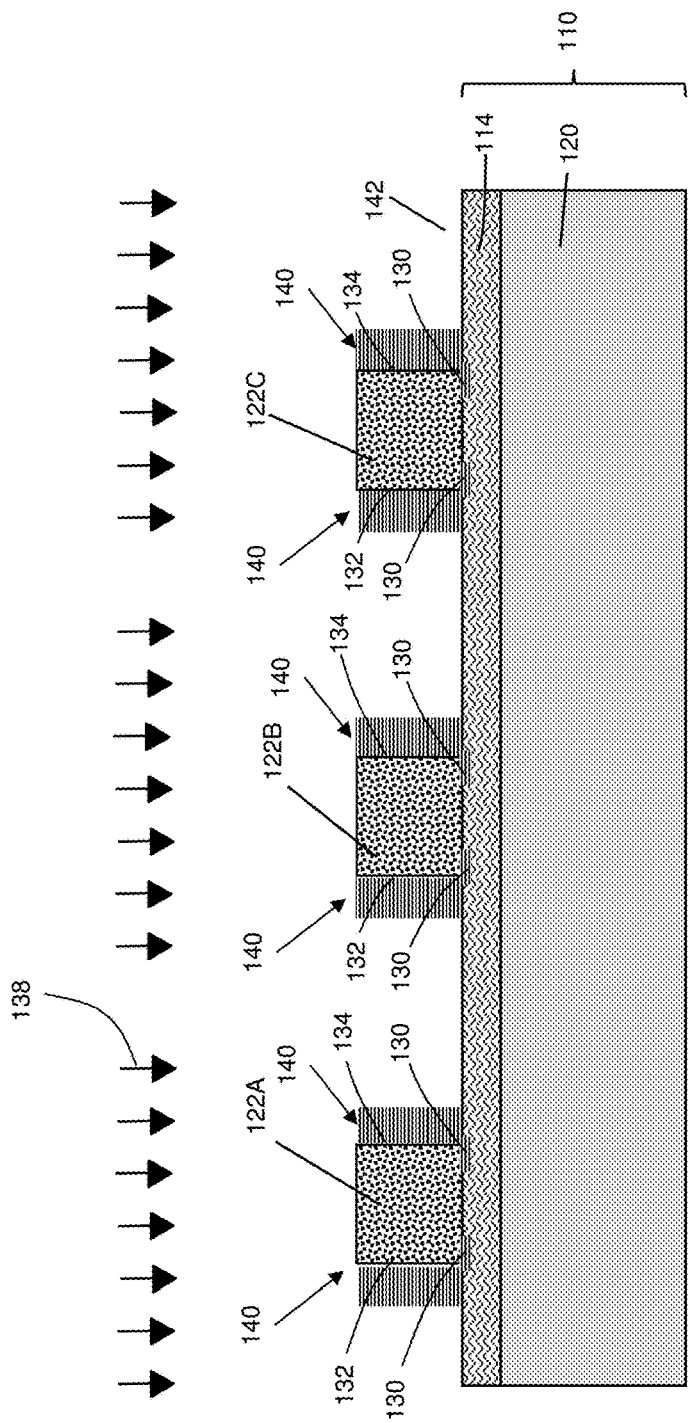

FIGS. 4 and 5 show forming spacers 140 (FIG. 5). FIG. 4 shows depositing a spacer material 142 over mandrel(s) 122A-C and into undercut spaces 130 under opposing sides 132, 134 of mandrel(s) 122A-C. While all mandrels 122A-C have undercut spaces 130, as described, that is not necessary in all cases. In this embodiment, spacer material 142 extends into undercut spaces 130 in hard mask 114. Spacer material 142 may be formed, for example, by depositing a the material over each mandrel(s) 122A-C such as an unannealed material having a high dielectric constant, including, but not limited to aluminum oxide, titanium oxide, tantalum pentoxide, and hafnium oxide. In one non-limiting example, titanium oxide is used. The depositing may include, for example, a chemical vapor deposition (CVD).

Figure 6:
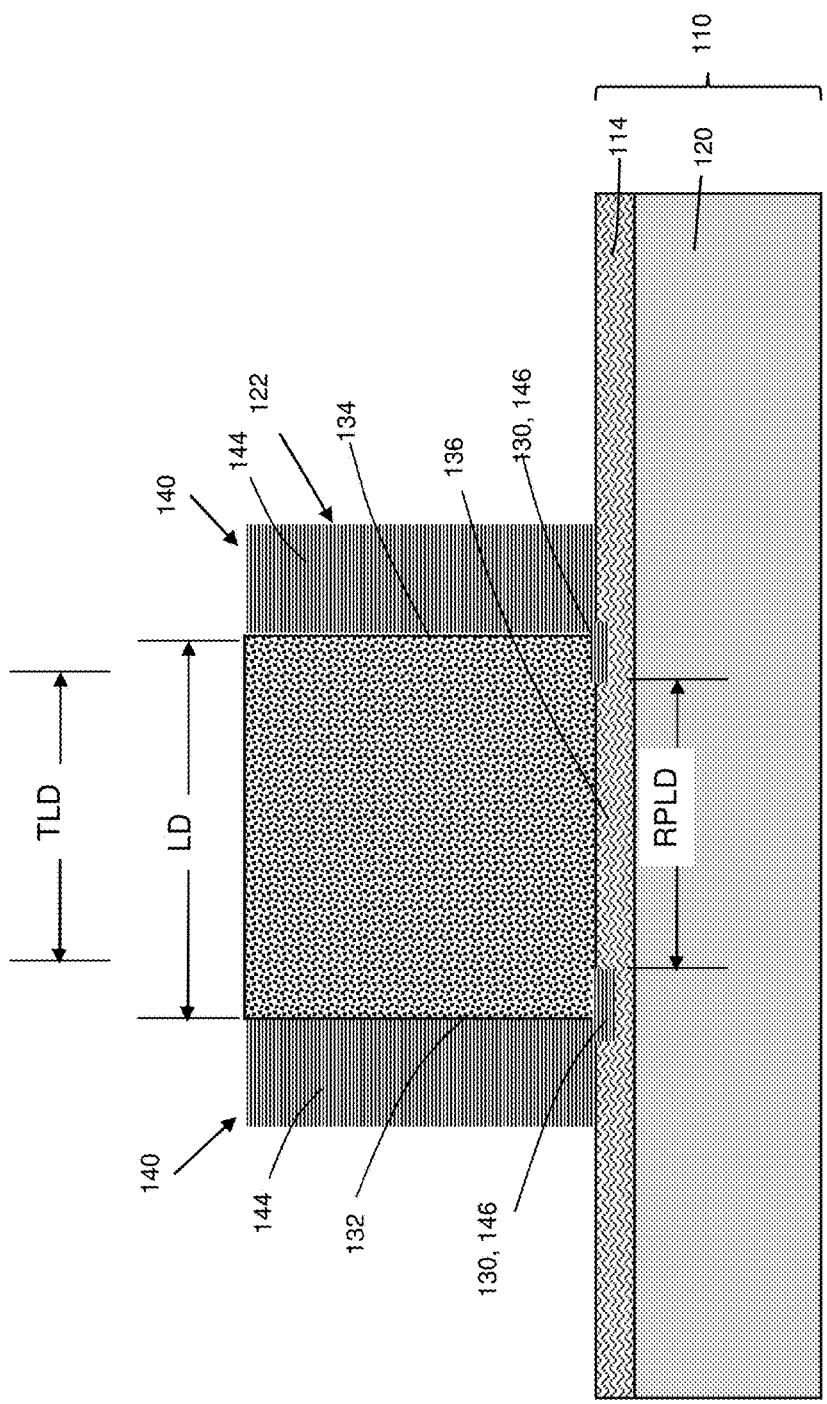

FIG. 5 shows etching spacer material 142 (FIG. 4), forming a pair of spacers 140 adjacent each mandrel 122A-C. As shown in the enlarged cross-sectional view of FIG. 6, each spacer 140 includes a vertical spacer portion 144 on each side 132, 134 of mandrel 122 and an undercut spacer portion 146 extending into a respective undercut space 130 from a respective vertical spacer portion 144. Spacers 140 on a given mandrel thus form somewhat opposing 'L' shaped structures. Undercut spacer portions 146 may define a sub-lithographic lateral dimension (RPLD) therebetween. Again, in this embodiment, undercut spacer portions 146 are in hard mask 114.

Figure 7:
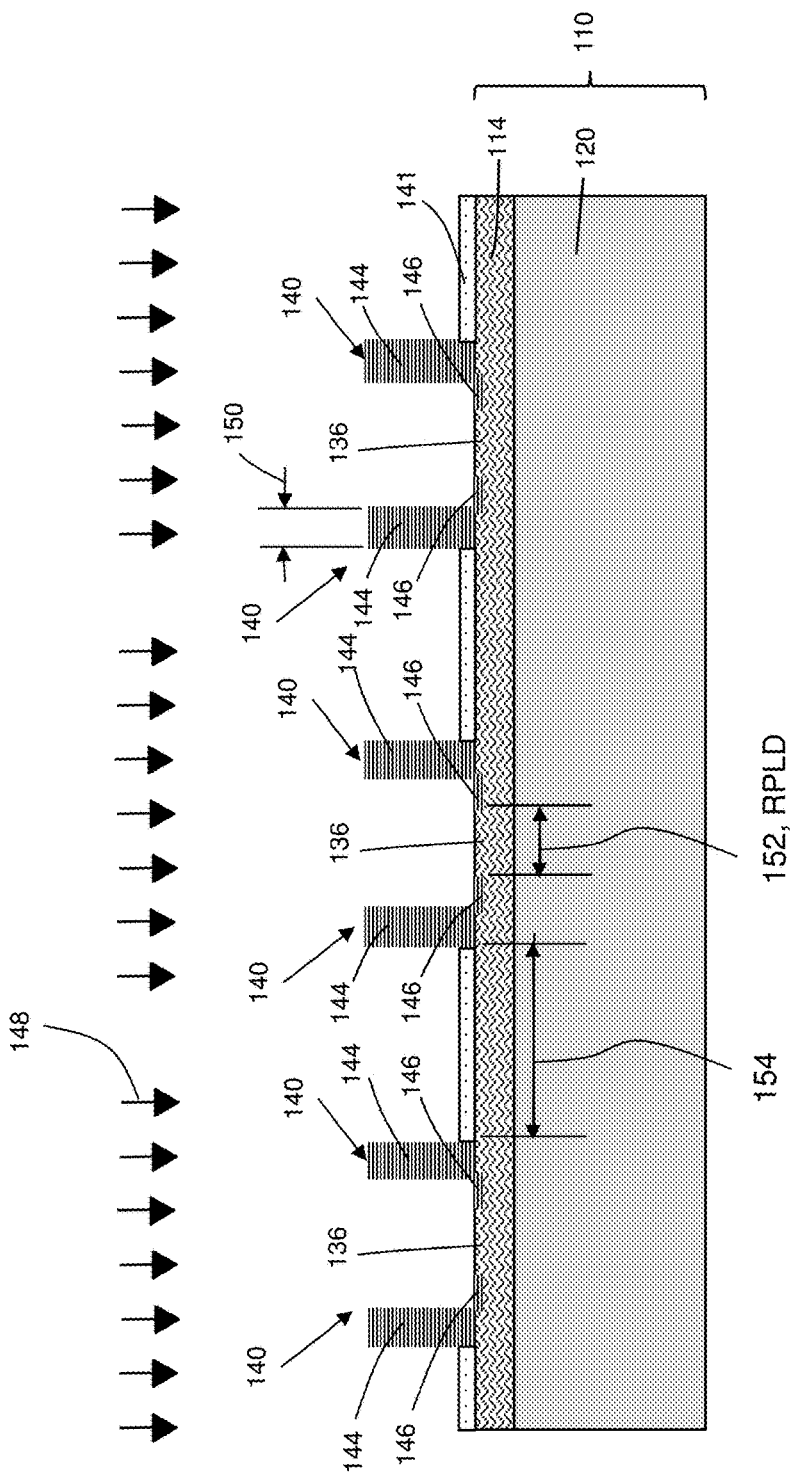

FIG. 7 shows removing mandrels 122A-C, leaving spacers 140 freestanding over underlying layer 110. That is, each mandrel 122A-C may be removed such that spacers 140 adjacent to sidewalls of mandrels 122A-C remain. This step may be referred to as a "mandrel pull." In this situation, an optical dispersive layer (ODL) 141 may be applied, and then pulled back to reveal the mandrels. Mandrels 122A, 122B, 122C may be removed using any conventional process selective to hard mask 114 like an etch 148, e.g., a RIE, a hydrogen bromide (HBr) containing plasma, etc., with ODL 141 protecting non-mandrel areas. Per conventional SADP processing, each vertical spacer portion 144 may have a sub-lithographic lateral dimension 150. That is, sub-lithographic lateral dimension 150 may be defined by a width of vertical spacer portions 144. In addition, in accordance with embodiments of the disclosure, now freestanding spacers 140 may also include undercut spacer portions 146 defining a mandrel space 152 in addition to vertical spacer portions 144 defining a non-mandrel space 154 (in a space in which a mandrel was never present). In contrast to conventional processes, a lateral dimension RPLD of mandrel space 152 is defined not by a lateral dimension of mandrels 122, but by how much undercuts 130 (FIG. 6) leave of remaining portion 136 of hard mask 114. That is, a lateral dimension RPLD of mandrel space 152 and remaining portion 136 is defined by undercut spacer portions 146, not by the width of the removed mandrels. The lateral dimension RPLD may be sized to meet target lateral dimension (TLD). i.e., RPLD=TLD. Non-mandrel space 154, mandrel space 152 and vertical spacer portions 144 width 154 may all be configured to provide sub-lithographic lateral dimensions. Each may have a dimension chosen to be the same as that of the desired width of a final sub-lithographic structure to be formed in underlying layer 110. In contrast to conventional processing, however, mandrel space 152 may achieve sub-lithographic dimensions not possible using just mandrels 122. For example, mandrel space 152 may be equal to approximately 12-20 nm.

Figure 8:
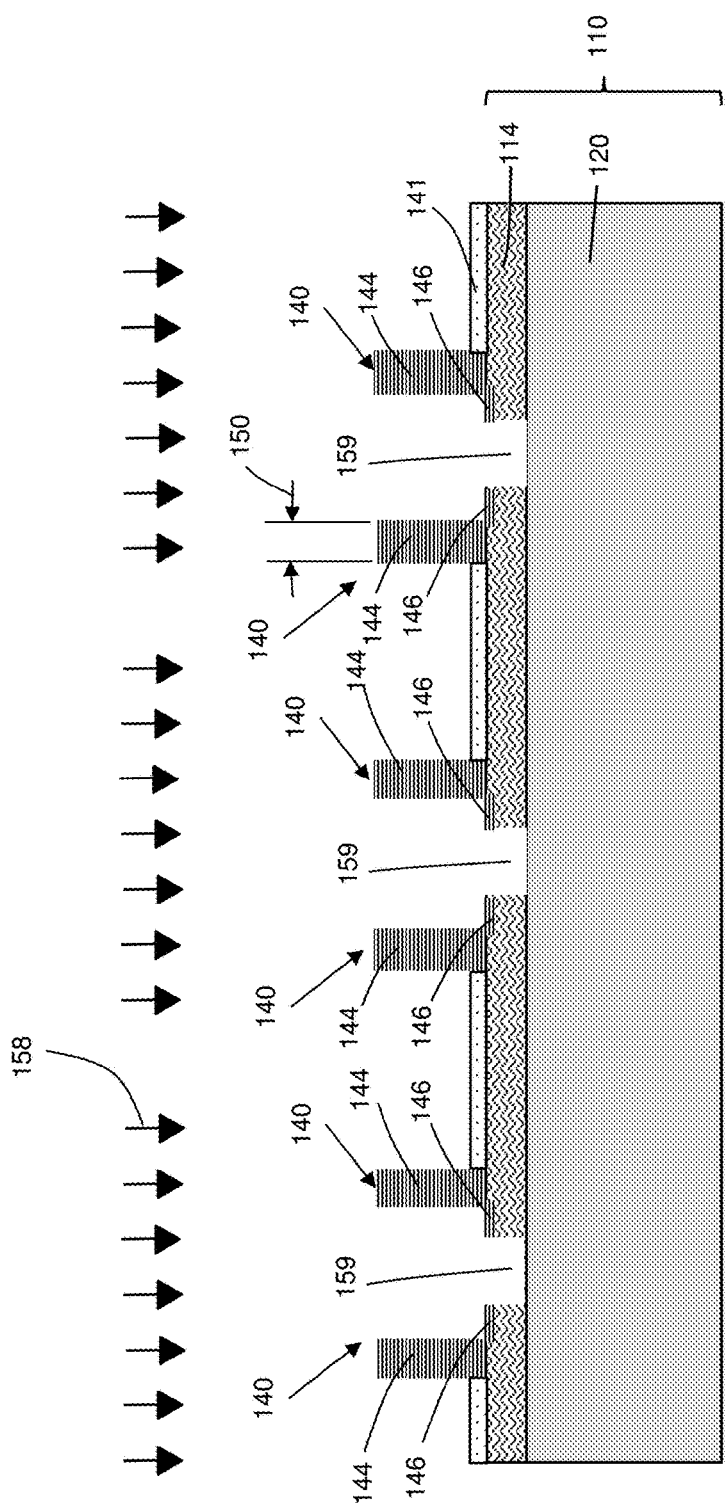
Figure 9:
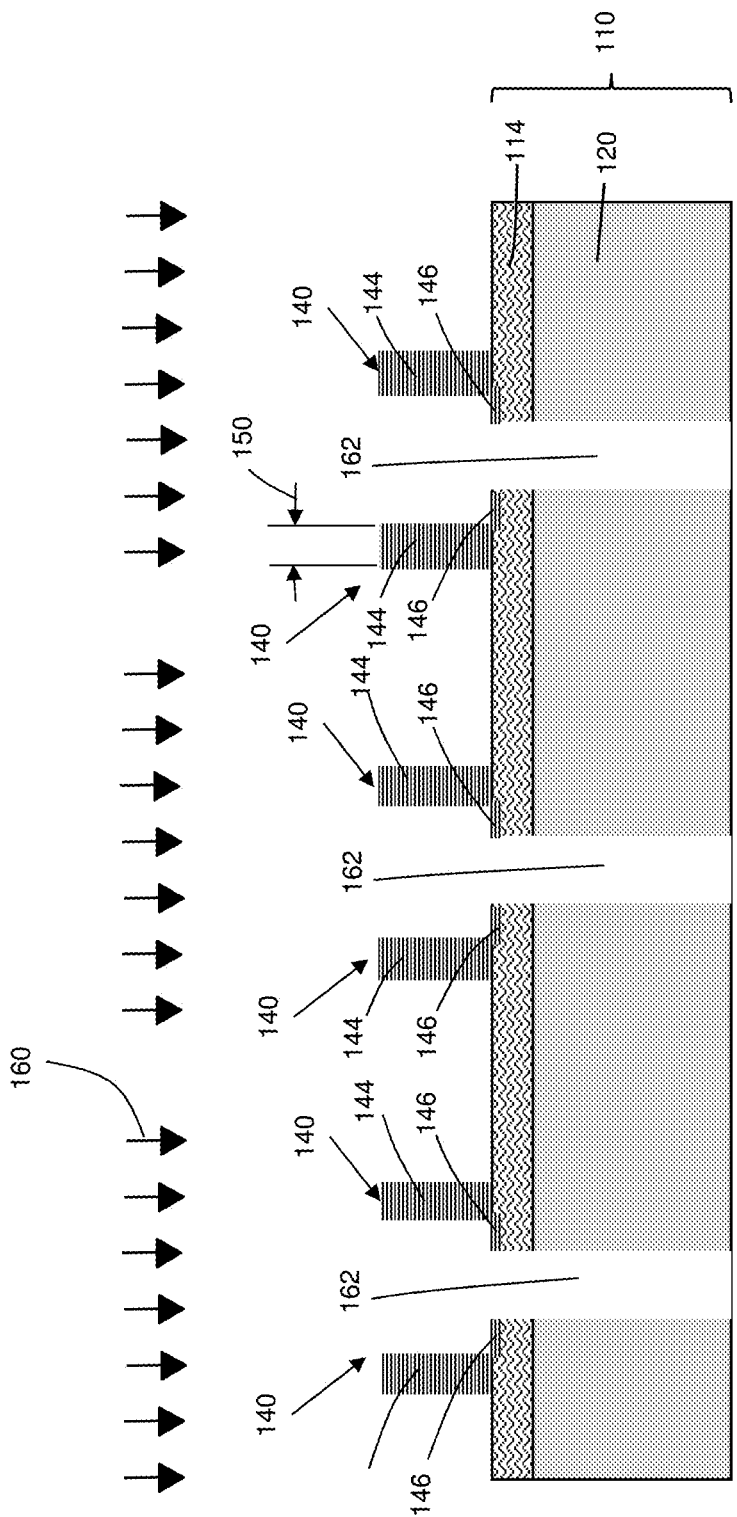

Once mandrels 122 are removed, processing may proceed with several etch processes to form a sub-lithographic feature in at least underlying layer 110 using spacers 140. For example, as shown in FIG. 8, an etch 158 may be performed to remove hard mask 114 between undercut spacer portions 146, i.e., etch to pattern the sub-lithographic structures into hard mask 114 and remove remaining portion 136 (FIG. 7) using undercut spacer portions 146 as a pattern of the sub-lithographic structure. ODL 141 protects the non-mandrel areas. A hard mask pattern 159 is the result. ODL 141 can then be removed, e.g., using an ashing process. Additionally, as shown in FIG. 9, another etch 160 may be performed to remove dielectric layer 120 using patterned hard mask 114. That is, sub-lithographic structures 162, e.g., openings, may be formed in semiconductor layer 110 using patterned hard mask 114. Either etch process 158, 160 may include any now known or later developed chemistry for etching hard mask 114 such as but not limited to a fluorocarbon reactive ion etch (RIE), etc. While two etches have been described, it is understood that one or more than two etches may be employed, where desired and appropriate chemistries can attain the desired results, e.g., into additional layers not shown. Other etching processes may also be employed, such as a wet etch to remove spacers 140, e.g., hydrofluoric acid (HF) based for oxide spacers. Additionally, an optional etch (not shown) may be performed to remove remaining hard mask 114, e.g., by a conventional wet etch for nitride. It is possible, however, to allow hard mask 114 to remain for later use. Processing hereafter may continue in a conventional fashion to form structures using the features, i.e., openings, shown.

Figure 10:
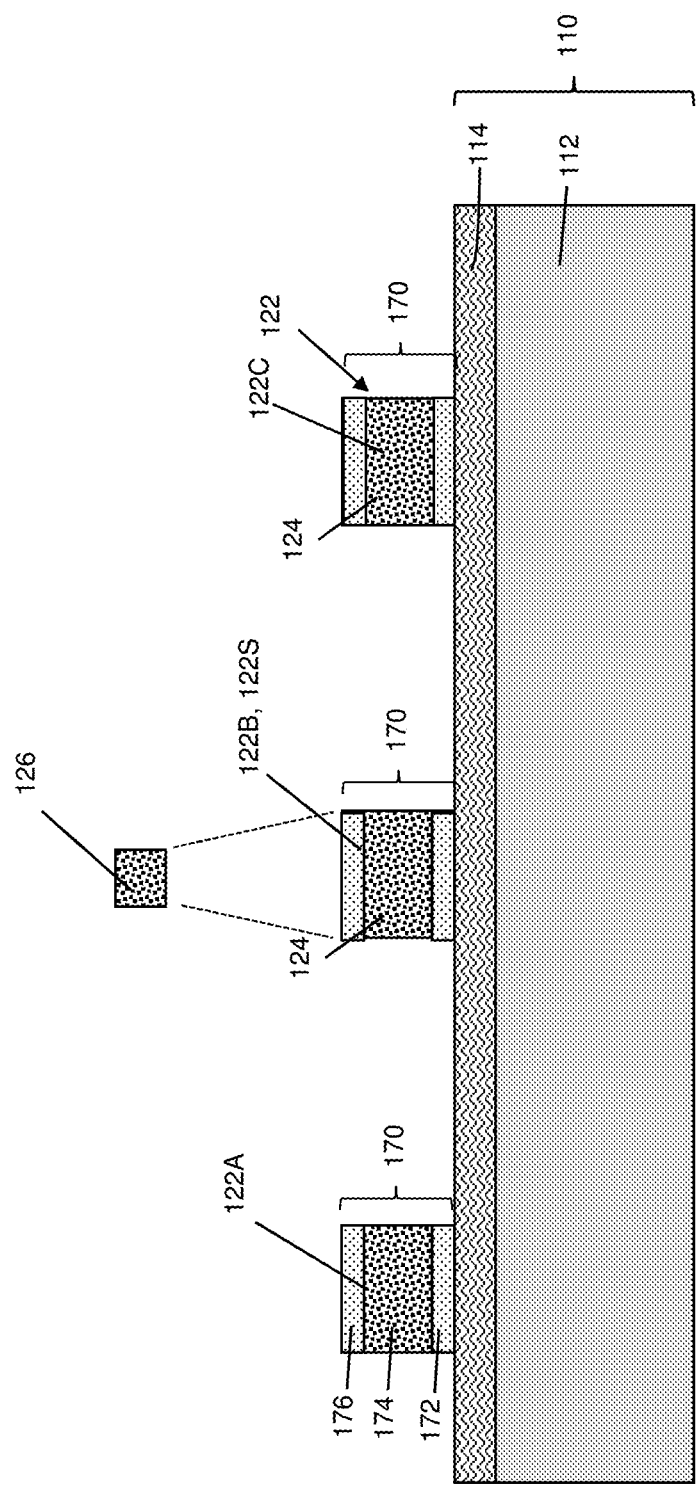
FIG. 10-18 shows a cross-sectional views of a controlling a lateral dimension of a mandrel space using undercutting of the mandrel into an undercut layer over a hard mask, according to embodiments of the invention.

Referring to FIGS. 10-18, in another embodiment, mandrels 122 may be formed in a different manner than in the previous embodiment. As shown in FIG. 10, in this embodiment, mandrels 122 are formed as a mandrel stack 170 including an undercut layer 172 over underlying layer 110, e.g., hard mask 114 over dielectric layer 112, and a mandrel body 174 over undercut layer 172. This embodiment may include depositing undercut layer 172 on underlying layer 110, and a body member layer (not shown) over undercut layer 172. In one embodiment, mandrels 122A-C may then be formed by patterning the layers into the plurality of layered material blocks in any now known or later developed manner. In an optional embodiment, each mandrel stack 170 may also include a capping layer 176, but this is not necessary in all instances. Undercut layer 172 and/or capping layer 176 may include, for example, silicon oxide, while mandrel body 174 may include any of the aforementioned materials for mandrel body 124 (FIG. 1).

Figure 11:
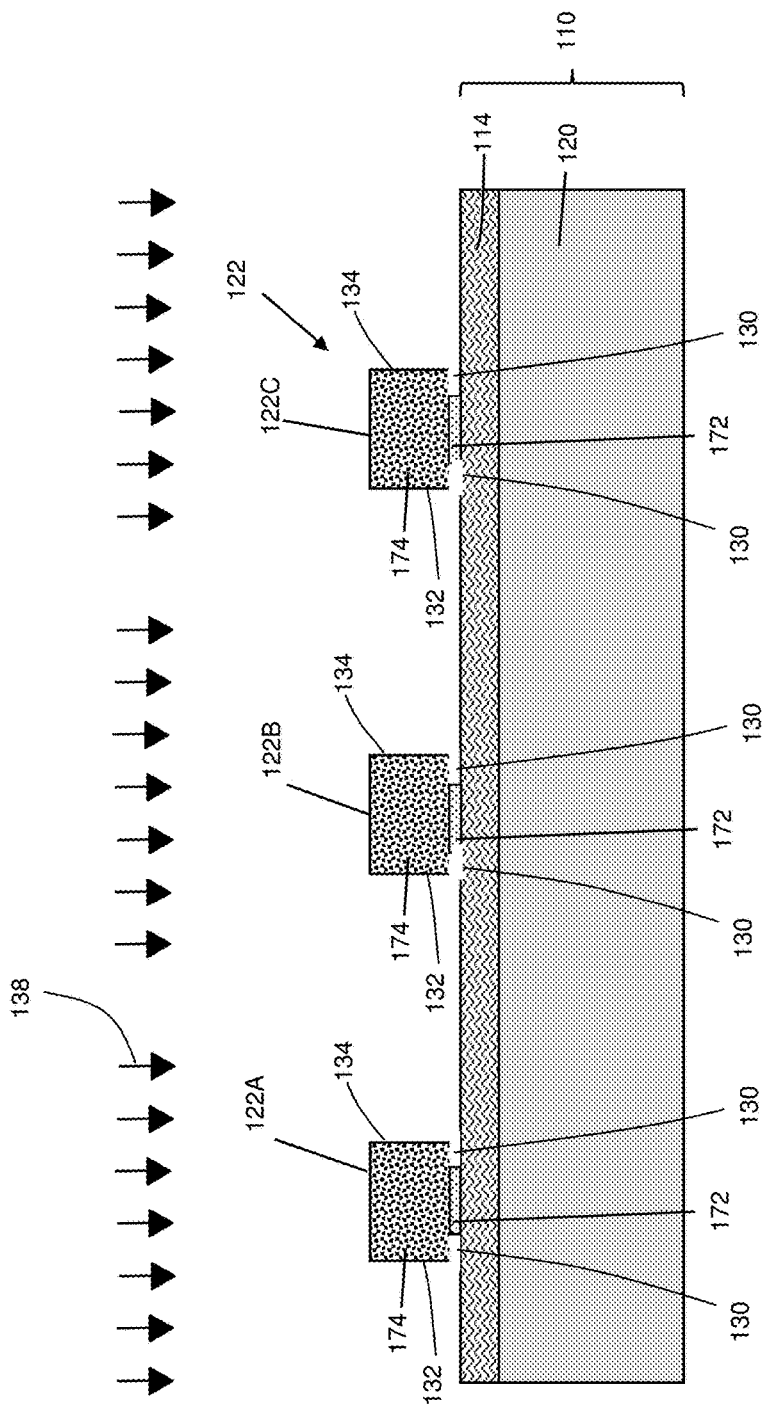
Figure 12:
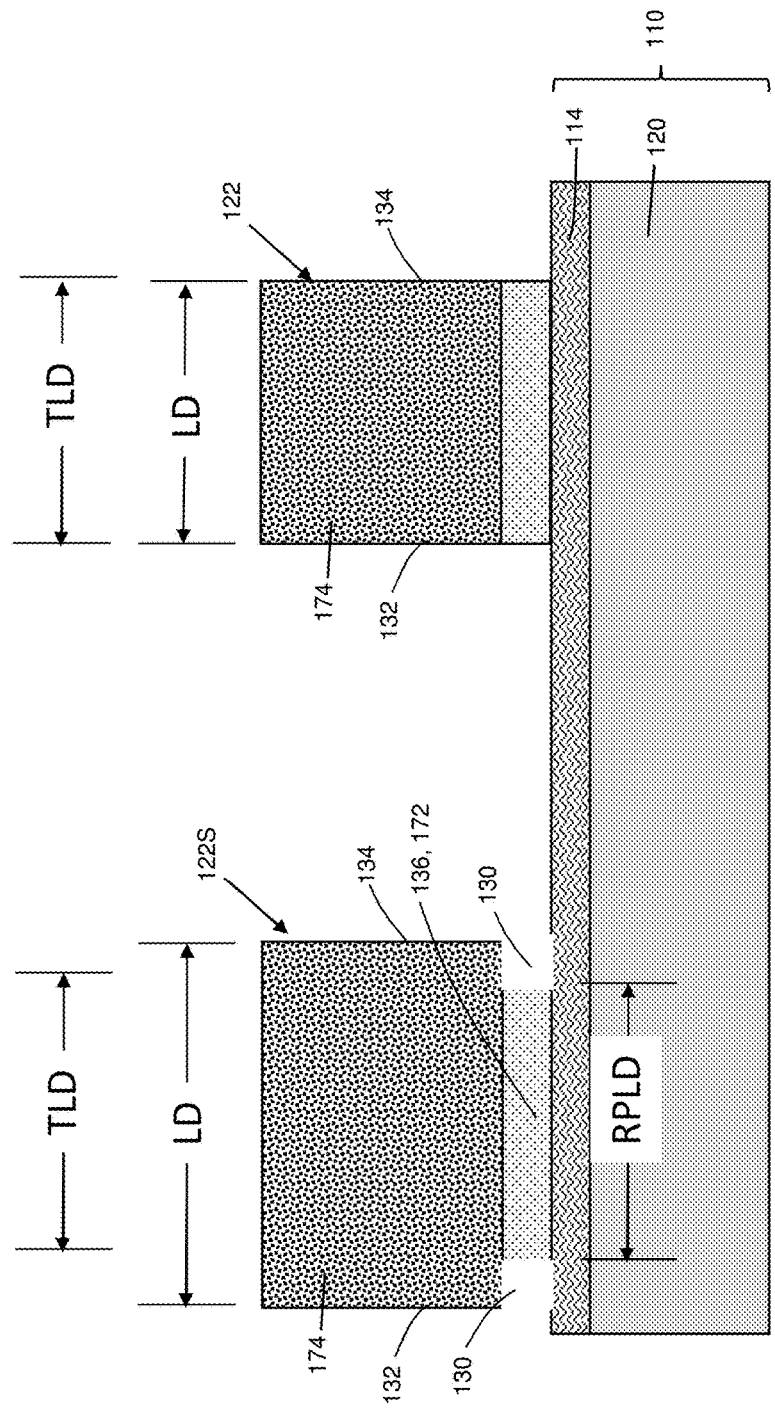

As shown in FIG. 11 and the enlarged cross-sectional view of FIG. 12, in this embodiment, the undercutting of mandrel(s) 122 forms the undercut space 130 in undercut layer 172, rather than in hard mask 114 as in FIGS. 2-3. That is, embodiments of the disclosure may include undercutting mandrel(s) 122A-C, forming an undercut space 130 under opposing sides 132, 134 of mandrel 122A-C. In one embodiment, each undercut space 130 may be 10-12 nm (across different pitches/features). As in the previous embodiment, the undercutting may include a wet etch configured to precisely size undercut space 130. As noted, undercutting of mandrel(s) 122A-C in accordance with embodiments of the disclosure may be applied generally to each mandrel 122, or selectively to selected mandrels 122S, as previously described herein.

Regardless of how approached, the undercutting is controlled to form undercut space 130 under opposing sides 132, 134 of mandrel(s) 122 such that a lateral dimension (RPLD) (FIG. 12) of a remaining portion 136 of material (i.e., undercut layer 172) between undercut spaces 130 matches target lateral dimension (TLD). As will be described, a dimension of remaining portion 136 (RPLD) sets the lateral dimension of the structure to be formed using hard mask 114 patterned using the spacers in remaining parts of the SADP process according to embodiments of the disclosure. As shown in FIG. 11, the undercutting may include a wet etch 138 configured to precisely size undercut spaces 130. Here, undercut layer 172 etches out under sides 132, 134 of mandrel 122. In one non-limiting example, the undercutting may be performed in an Applied Materials® Selectra® model etching system, which is capable of controlled wet etching 138 with very high selectivity. The undercutting can be monitored using an in-line metrology system (not shown), as described previously. A directional RIE may also be alternatively employed to perform the undercut. In this embodiment, undercutting mandrels 122 forms undercut space 130 in undercut layer 172, i.e., over hard mask 114 of underlying layer 110.

Figure 13:
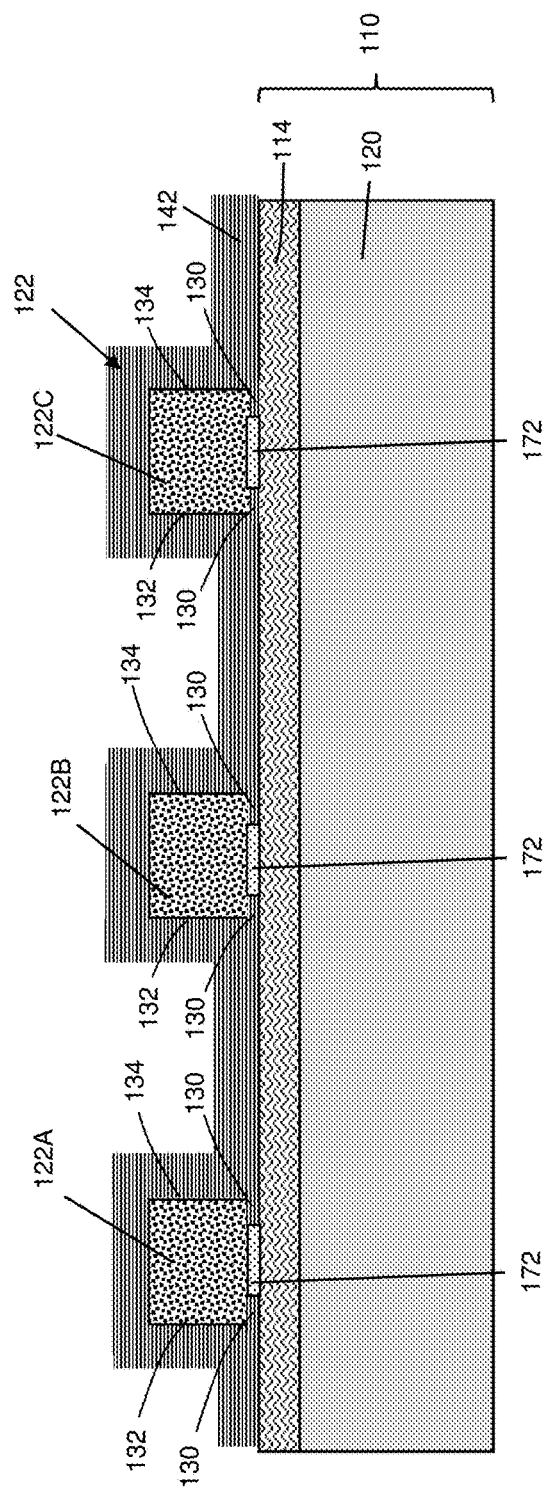
Figure 14:
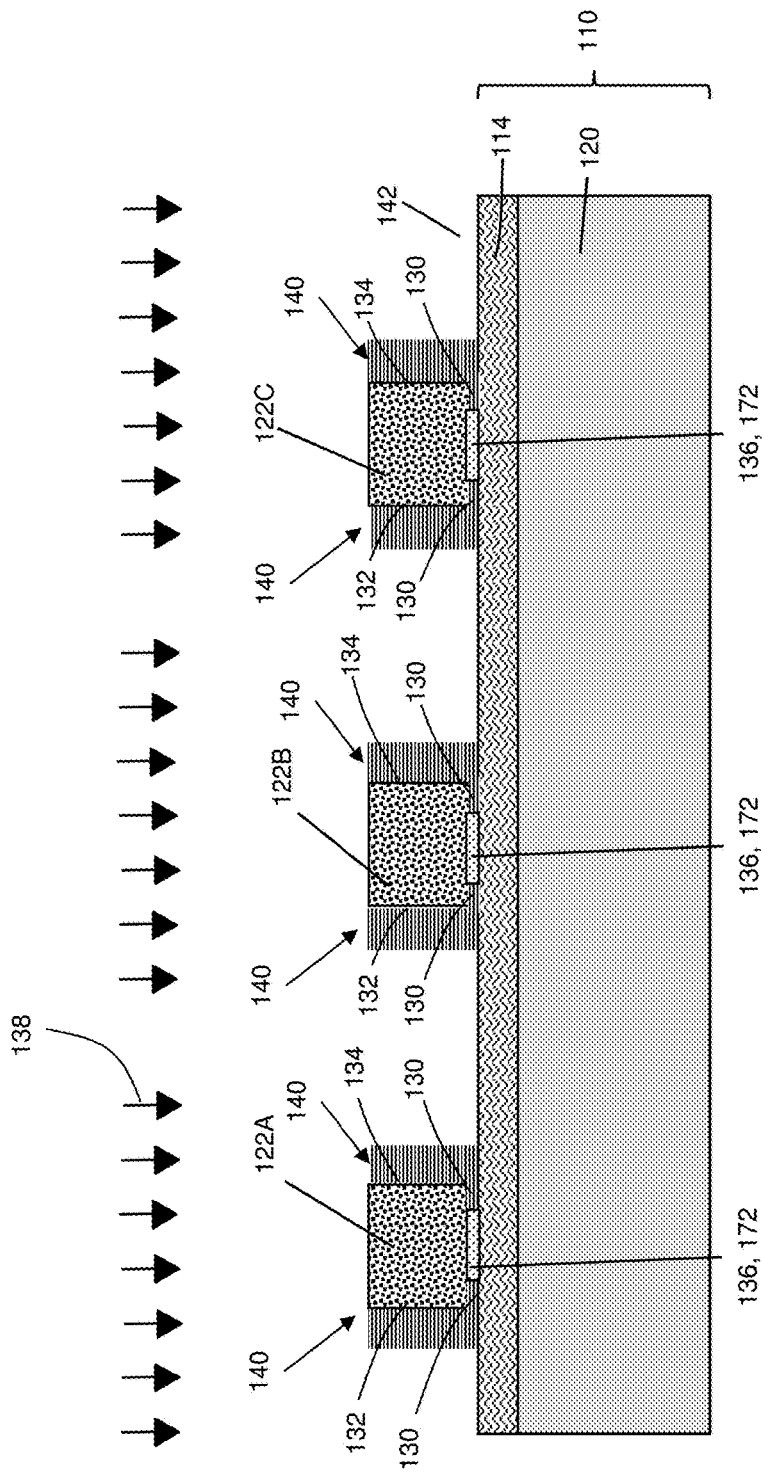
Figure 15:
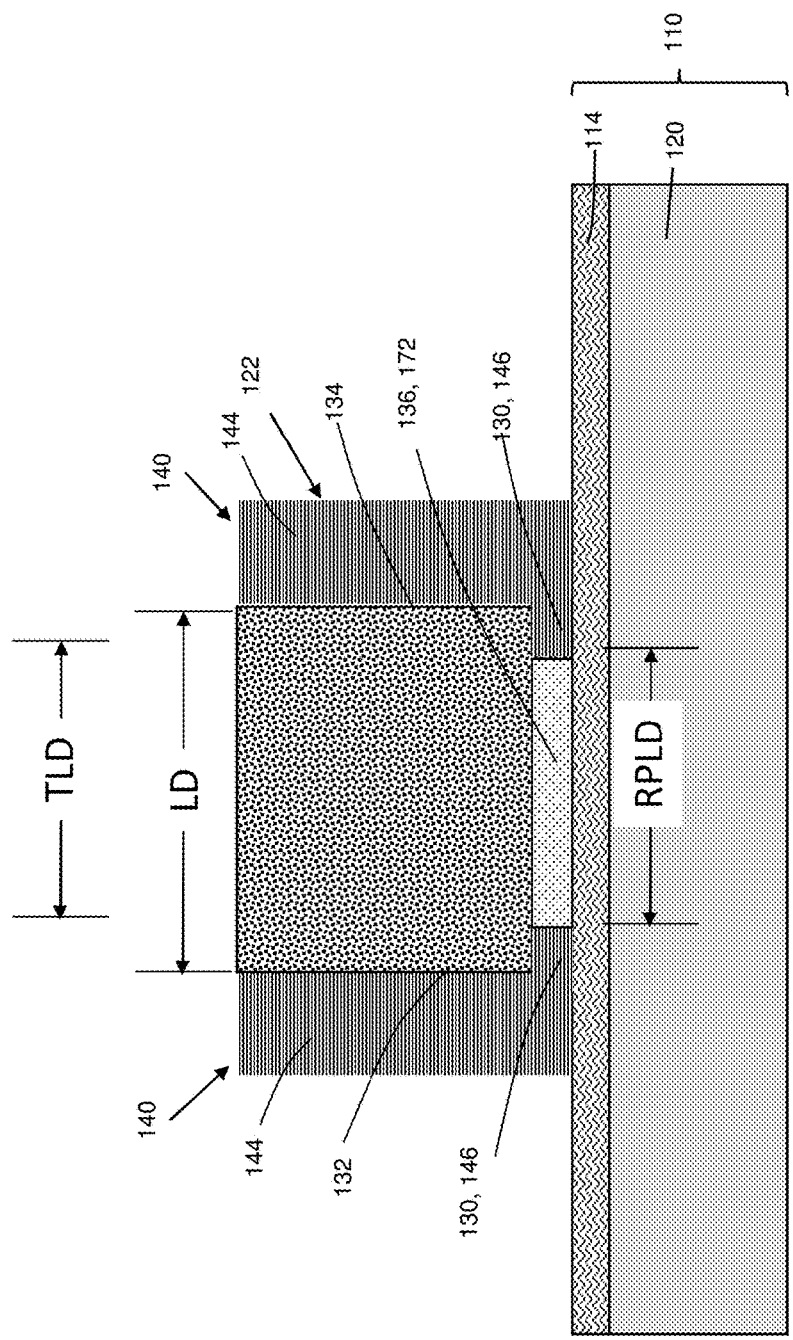

FIGS. 13 and 14 show forming spacers 140 (FIG. 14). FIG. 13 shows depositing a spacer material 142 over mandrel(s) 122A-C and into undercut spaces 130 under opposing sides 132, 134 of mandrel(s) 122A-C. In this embodiment, spacer material 142 extends into undercut spaces 130 in undercut layer 172. Spacer material 142 may be formed, for example, by depositing a material over each mandrel(s) 122A-C such as an un-annealed material having a high dielectric constant, including, but not limited to aluminum oxide, titanium oxide, tantalum pentoxide, and hafnium oxide. In one non-limiting example, titanium oxide is used. The depositing may include, for example, a chemical vapor deposition (CVD).

FIG. 14 shows etching spacer material 142 (FIG. 13), forming a pair of spacers 140 adjacent each mandrel 122A-C. As shown in the enlarged cross-sectional view of FIG. 15, each spacer 140 includes a vertical spacer portion 144 on each side 132, 134 of mandrel 122 and an undercut spacer portions 146 extending into respective undercut spaces 130 from respective vertical spacer portions 144. Undercut spacer portions 146 define a lateral dimension (RPLD) therebetween. The lateral dimension RPLD between undercut spacer portions 146, i.e., of remaining portion 136, meets target lateral dimension (TLD). In this embodiment, undercut spacer portions 146 are in undercut layer 172, i.e., adjacent remaining portion 136 thereof.

Figure 16:
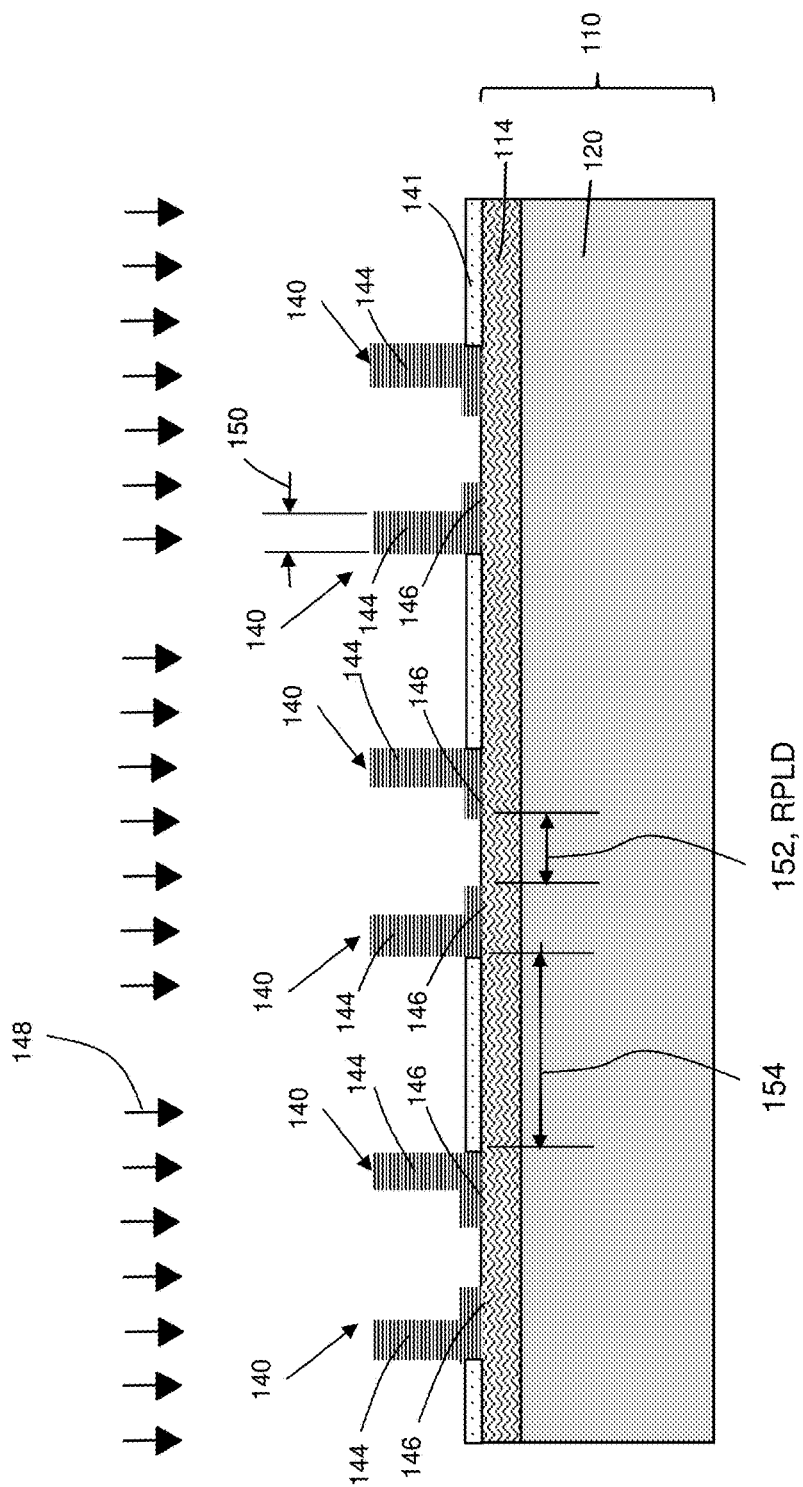

FIG. 16 shows removing mandrels 122A-C, leaving spacers 140 freestanding over underlying layer 110, i.e., mandrel pull. That is, each mandrel 122A-C may be removed such that spacers 140 adjacent to sidewalls of mandrels 122A-C remain. Mandrel removal includes removing undercut layer 172 (FIGS. 13-14) between undercut spacer portions 146. In this situation, an optical dispersive layer (ODL) 141 may be applied, and then pulled back to reveal the mandrels. Mandrels 122A, 122B, 122C may be removed using any conventional process selective to hard mask 114 like an etch 148, e.g., a RIE, a hydrogen bromide (HBr) containing plasma, etc. with ODL 141 protecting non-mandrel areas. Per conventional SADP processing, each vertical spacer portion 144 may have a sub-lithographic lateral dimension 154. That is, lateral dimension 150 may be defined by a width of vertical spacer portions 144. In addition, and as described herein, now freestanding spacers 140 may also include undercut spacer portions 146 defining a mandrel space 152 in addition to vertical spacer portions 146 defining a non-mandrel space 154 (in a space in which a mandrel was never present). In contrast to conventional processes, a lateral dimension RPLD of mandrel space 152 is defined by a lateral dimension of mandrels 122, but by how much undercuts 130 (FIG. 15) leave of remaining portion 136 of undercut layer 172. That is, a lateral dimension RPLD of mandrel space 152 and remaining portion 136 is defined by undercut spacer portions 146, not by the width of the removed mandrels. As noted, non-mandrel space 150, mandrel space 152 and vertical spacer portions 144 may all be configured to provide sub-lithographic lateral dimensions. Each may have a dimension chosen to be the same as that of the desired width of a final sub-lithographic structure to be formed in underlying layer 110. In contrast to conventional processing, however, mandrel space 152 may achieve sub-lithographic dimensions not possible using just mandrels 122. For example, mandrel space 152 may be equal to approximately 12-20 nm.

Figure 17:
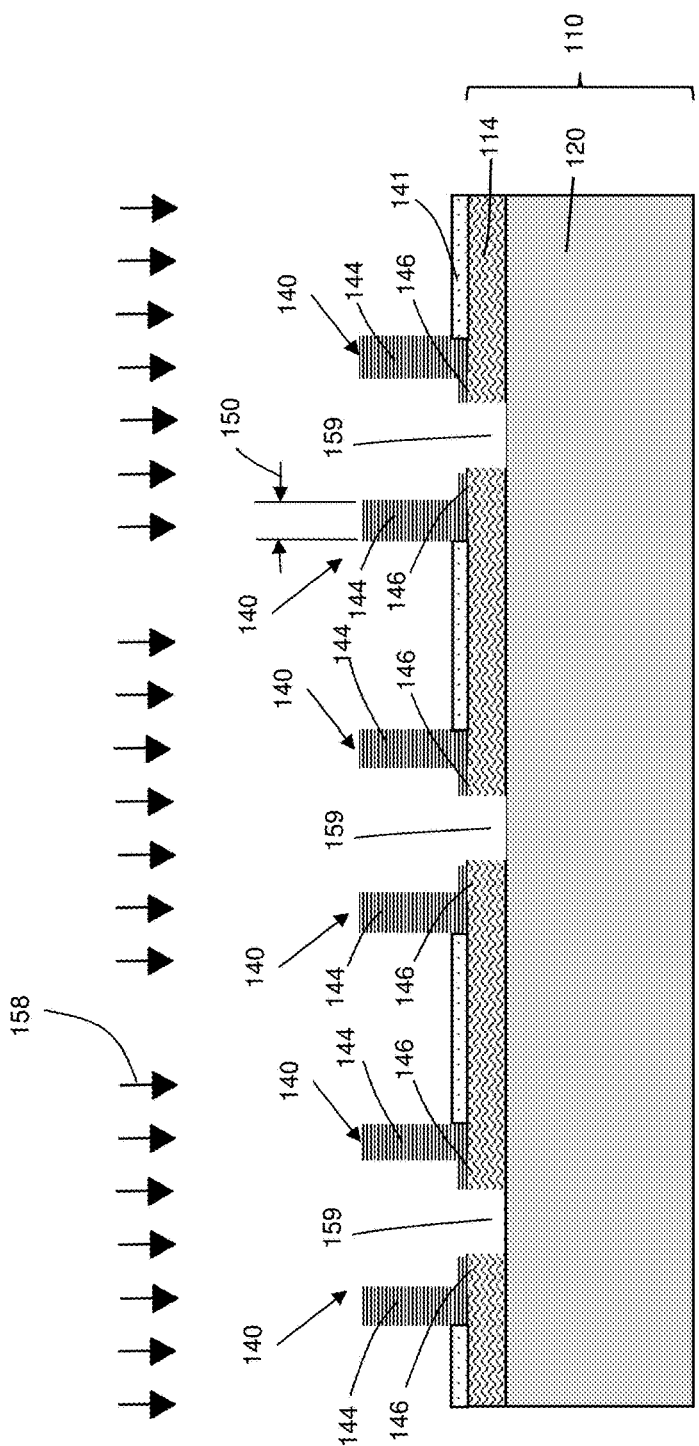
Figure 18:
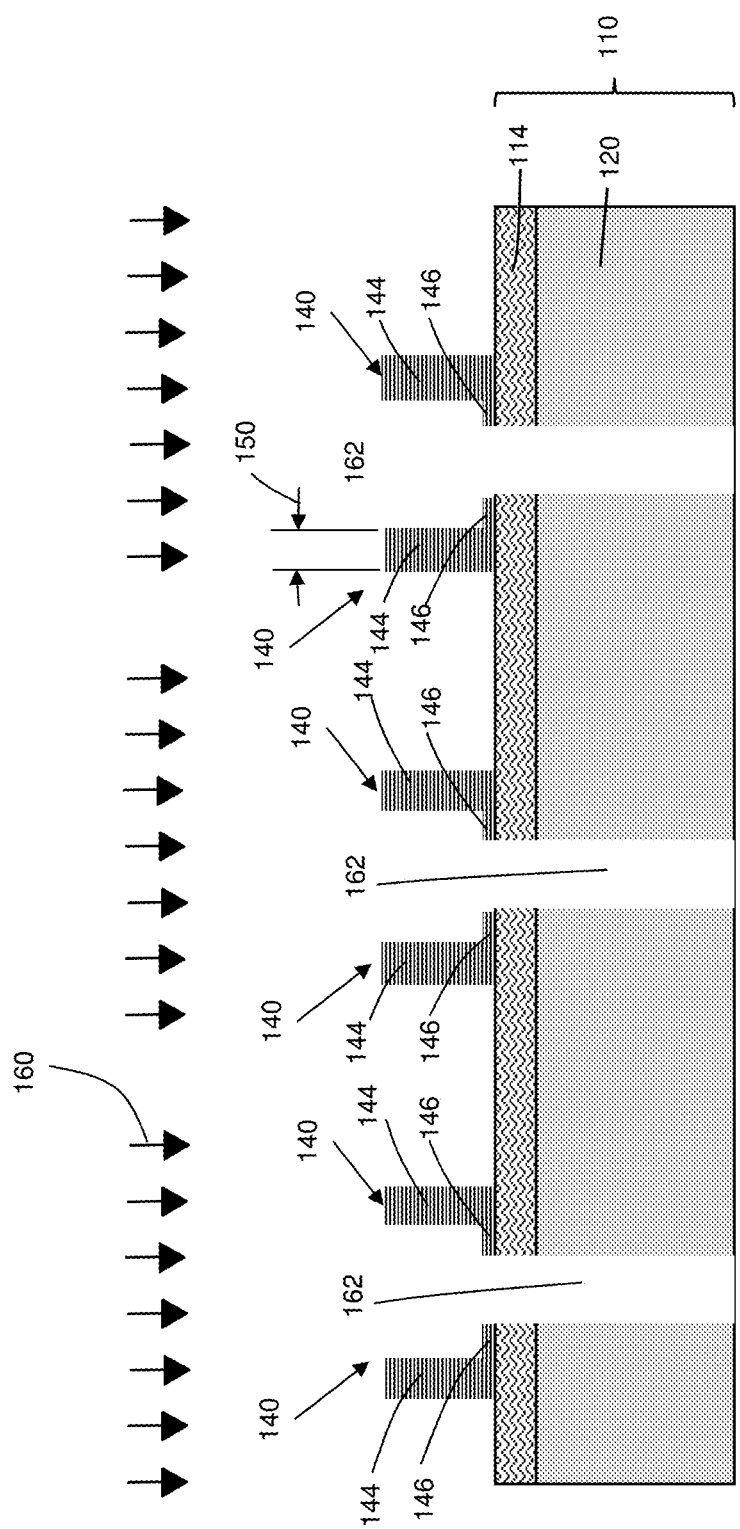

Once mandrels 122 are removed, processing may proceed with several etch processes to form a sub-lithographic feature in at least underlying layer 110 using spacers 140. For example, as shown in FIG. 17, an etch 158 may be performed to remove hard mask 114 between undercut spacer portions 146, i.e., etch to pattern the sub-lithographic structures into hard mask 114 and remove remaining portion 136 (FIG. 16) using undercut spacer portions 146 as a pattern of the sub-lithographic structure. A hard mask pattern 159 is the result. ODL 141 can then be removed, e.g., using an ashing process. Additionally, as shown in FIG. 18, another etch 160 may be performed to remove dielectric layer 120 using patterned hard mask 114. That is, sub-lithographic structures 162, e.g., openings, may be formed in semiconductor layer 110 using patterned hard mask 114. Either etch process 158, 160 may include any now known or later developed chemistry for etching hard mask 114 such as but not limited to a fluorocarbon reactive ion etch (RIE), etc. While two etches have been described, it is understood that one or more than two etches may be employed, where desired and appropriate chemistries can attain the desired results, e.g., into additional layers not shown. Other etching processes may also be employed, such as a wet etch to remove spacers 140, e.g., hydrofluoric acid (HF) based for oxide spacers. Additionally, an optional etch (not shown) may be performed to remove remaining hard mask 114, e.g., by a conventional wet etch for nitride. It is possible, however, to allow hard mask 114 to remain for later use. Processing hereafter may continue in a conventional fashion to form structures using the features, i.e., openings, shown.

Embodiments of the disclosure provide methods to either generally or specifically modify a mandrel space lateral dimension in an SADP method. For example, an approximately 5 nm width reduction of mandrel space may be achieved using the technique. Advantageously, the progress of the undercutting and a remaining portion lateral dimension can be monitored by in-line scatterometry to allow for precise sizing. The methods can be used on newly formed devices, or can be applied to rework previously formed devices, allowing large out-of-target mandrel critical dimensions to be addressed, saving valuable wafers from scrap in a high volume manufacturing setting.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A self-aligned double patterning (SADP) method, comprising:
    forming a mandrel over an underlying layer;
    undercutting the mandrel forming an undercut space under opposing sides of the mandrel;
    depositing a spacer material over the mandrel and into the undercut space under the opposing sides of the mandrel;
    etching the spacer material, forming a pair of spacers adjacent the mandrel, each spacer including a vertical spacer portion on each side of the mandrel and an undercut spacer portion extending into the undercut space from the vertical spacer portion, the undercut spacer portions defining a sub-lithographic lateral dimension therebetween;
    removing the mandrel; and
    etching to form a sub-lithographic feature in at least the underlying layer using the spacers.

2. The SADP method of claim 1, wherein the undercutting of the mandrel forms the undercut space in the underlying layer.

3. The SADP method of claim 2, wherein the underlying layer includes a hard mask layer, the hard mask layer positioned over a dielectric layer.

4. The SADP method of claim 1, wherein the mandrel forming includes:
    forming a mandrel stack including an undercut layer over the underlying layer and a mandrel body over the undercut layer; and
    forming the mandrel from the undercut layer and the mandrel body,
    wherein the undercutting the mandrel forms the undercut space in the undercut layer.

5. The SADP method of claim 4, wherein the undercut layer includes silicon oxide and the mandrel body includes amorphous silicon.

6. The SADP method of claim 4, wherein the mandrel stack further includes a capping layer over the mandrel body.

7. The SADP method of claim 4, wherein the underlying layer includes a hard mask layer, the hard mask layer positioned over a dielectric layer.

8. The SADP method of claim 1, further comprising:
    after forming the mandrel, measuring a lateral dimension of the mandrel;
    determining whether the measured lateral dimension of the mandrel meets a target lateral dimension; and
    in response to the measured lateral dimension being larger than the target lateral dimension, controlling the undercutting of the mandrel to form the undercut space under opposing sides of the mandrel such that a lateral dimension of a remaining portion of material between the undercut spaces matches the target lateral dimension.

9. A method for self-aligned double patterning (SADP), the method comprising:
    forming a plurality of mandrels over an underlying layer, each mandrel including a mandrel body;
    after forming the plurality of mandrels, measuring a lateral dimension of the mandrel body of at least one selected mandrel;
    determining whether the measured lateral dimension of each selected mandrel meets a target lateral dimension;
    for each selected mandrel for which the measured lateral dimension is larger than the target lateral dimension, undercutting the mandrel body thereof thereby forming an undercut mandrel including an undercut space under opposing sides of the respective mandrel body such that a lateral dimension of a remaining portion of material between the undercut spaces matches the target lateral dimension;
    depositing a spacer material over the plurality of mandrels, the spacer material extending into the undercut space under the opposing sides of each undercut mandrel;
    etching the spacer material to form a pair of spacers adjacent each mandrel, each spacer including a vertical spacer portion on each side of a respective mandrel, wherein each undercut mandrel further includes an undercut spacer portion extending into the undercut spaces thereof from the respective vertical spacer portions, the undercut spacer portions defining a sub-lithographic lateral dimension therebetween;
    removing each mandrel; and
    etching to form a sub-lithographic feature in at least the underlying layer.

10. The method of claim 9, wherein the undercutting the mandrel forms the undercut space in the underlying layer.

11. The method of claim 9, wherein the underlying layer includes a hard mask layer, the hard mask layer positioned over a dielectric layer.

12. The method of claim 9, wherein the mandrel forming includes:
    forming a mandrel stack including an undercut layer over the underlying layer and a mandrel body over the undercut layer; and
    forming the mandrel from the undercut layer and the mandrel body,
    wherein the undercutting the mandrel forms the undercut spaces in the undercut layer.

13. The method of claim 12, wherein the undercut layer includes silicon oxide and the mandrel body includes amorphous silicon.

14. The method of claim 13, wherein the mandrel stack further includes a capping layer over the mandrel body.

15. The method of claim 12, wherein the underlying layer includes a hard mask layer, the hard mask layer positioned over a dielectric layer.

16. A self-aligned double patterning (SADP) method, comprising:

undercutting a mandrel over an underlying layer, forming an undercut space under opposing sides of the mandrel;

depositing a spacer material over the mandrel and into the undercut space under the opposing sides of the mandrel;

etching the spacer material, forming a pair of spacers adjacent the mandrel, each spacer including a vertical spacer portion on each side of the mandrel and an undercut spacer portion extending into the undercut space from the vertical spacer portion, the undercut spacer portions defining a sub-lithographic lateral dimension therebetween;

removing the mandrel; and etching to form a sub-lithographic feature in at least the underlying layer using the spacers.

17. The SADP method of claim 16, wherein the undercutting the mandrel forms the undercut space in the underlying layer.

18. The SADP method of claim 16, wherein the mandrel includes a mandrel stack including an undercut layer over the underlying layer and a mandrel body over the undercut layer, wherein the undercutting the mandrel forms the undercut space in the undercut layer.

19. The SADP method of claim 16, further comprising:

prior to the undercutting, measuring a lateral dimension of the mandrel;

determining whether the measured lateral dimension of the mandrel meets a target lateral dimension; and in response to the measured lateral dimension being larger than the target lateral dimension, controlling the undercutting of the mandrel to form the undercut space under opposing sides of the mandrel such that a lateral dimension of a remaining portion of material between the undercut spaces matches the target lateral dimension.

20. The SADP method of claim 16, wherein the underlying layer includes a hard mask layer, the hard mask layer positioned over a dielectric layer.

\* \* \* \* \*